United States Patent [19]
Cronin

[11] Patent Number: 5,562,489
[45] Date of Patent: Oct. 8, 1996

[54] ELECTROSTATIC DISCHARGE PROTECTION DEVICE

[75] Inventor: David V. Cronin, Peabody, Mass.

[73] Assignee: Polaroid Corporation, Cambridge, Mass.

[21] Appl. No.: 278,024

[22] Filed: Jul. 20, 1994

[51] Int. Cl.⁶ .................................................. H01R 13/703
[52] U.S. Cl. ...................... 439/507; 439/509; 439/511; 439/512; 439/513; 439/514; 361/212; 361/220
[58] Field of Search .................................. 439/507, 509, 439/511, 512, 513, 514; 361/220, 212

[56] References Cited

U.S. PATENT DOCUMENTS

| | | | |
|---|---|---|---|
| 3,908,153 | 9/1975 | Cason, Jr. | 361/220 |
| 4,471,408 | 9/1984 | Martinez | 439/507 |

FOREIGN PATENT DOCUMENTS 2348630  3/1975  Germany.

Primary Examiner—P. Austin Bradley
Assistant Examiner—T. C. Patel
Attorney, Agent, or Firm—Christopher P. Ricci

[57] ABSTRACT

A plurality of electrostatic discharge protection devices are disclosed for use with semiconductor chip packaging such as surface mount chip packages wherein the electrostatic discharge protection devices have shorting arms that extend outward from the electrostatic discharge protection device to make contact with connector pins on the semiconductor chip package such that an electrical connection is made between all of the connector pins of the semiconductor chip package thereby creating a short circuit across the connector pins of the semiconductor chip package to protect the semiconductor chip package from electrostatic discharge. In one embodiment, the electrostatic discharge protection device automatically withdraws the shorting connection upon insertion of the semiconductor chip package onto a printed circuit board. In other embodiments the electrostatic discharge protection device is manually operated to remove the short upon mechanical movement of the device.

14 Claims, 13 Drawing Sheets

ELECTROSTATIC DISCHARGE PROTECTION DEVICE

BACKGROUND OF THE INVENTION

The present invention relates generally to electrostatic discharge protection devices. More particularly, the invention relates to electrostatic discharge protection devices for semiconductor chip packages CSCP") where the electrostatic discharge protection device connects selected pins on the SCP so they are grounded or maintained at the same electrical potential to inhibit electrostatic charge accumulation when the SCP is not mounted on a circuit board, and disconnects the ground connection upon operative combination of the SCP on the circuit board or, optionally, disconnects the ground connection manually by a user.

Electrostatic charge is a stationary electric charge which accumulates on various surfaces. An electrostatic discharge occurs when the electrostatic charge becomes substantial enough to overcome a dielectric material between the charge and another surface of lower electrical potential. An example of such a discharge as naturally occurring is lightning.

Electrostatic discharge in the realm of electronics can be devastating to microelectronic devices. A sharp voltage spike caused by an electrostatic discharge can cause permanent and costly damage to individual precision devices, such as random access memory or other semiconductor devices, inter alia.

Many commercially available electrostatic discharge protection devices in use today consist primarily of electrostatic discharge packaging of the SCP in electrically conductive strips, pellets, boxes, and plastic tubing which provide effective electrostatic discharge protection until the user is about to insert the SCP into complementary receptacles on the circuit board. At that point the user must remove the electrostatic discharge packaging from the SCP thus rendering the SCP vulnerable to electrostatic discharge in order to position and insert the connector pins into the receptacle. Accordingly, as the user inserts the connector pins of the SCP into the receptacles, the semiconductor dies housed within the SCPs could be destroyed by electrostatic discharge and the SCP would therefore have to be replaced. Moreover, certain types of SCPs, typically EPROMs, UVPROMs, and DRAMs are plug-in devices which have connector pins which are repeatedly inserted into and then removed from the receptacles. These types of SCPs require electrostatic discharge protection during the repeated insertions into and removal from the receptacles. Specifically, the connector pins of those SCPs require electrostatic discharge protection from the moment that their connector pins are removed from their receptacles until their connector pins are again inserted therein.

In some instances, where the receptacle itself is later subject to Electrostatic Discharge, it is advantageous to allow the electrostatic discharge protection device to remain in place and be switched manually to a de-shunted position.

Consequently a need still exists within; the semiconductor chip packaging industry for a true electrostatic discharge protection device, rather than electrostatic discharge protection packaging which effectively protects the semiconductor die from electrostatic discharge until the connector pins of the SCP are inserted into the receptacles of the connector and then protects the semiconductor die from electrostatic discharge again when the connector pins are removed from the receptacles. Surface mount microelectronic devices have an additional problem in that they often have numerous small pins, often on all four sides of the SCP, thereby making the surface mount device difficult to handle. A prior art electrical connector receptacle arrangement is described in commonly assigned U.S. Pat. No. 5,108,299 entitled "Electrostatic Discharge Protection Devices for Semiconductor Chip Packages" by David V. Cronin issued Apr. 28, 1992. This patent shows a shunt attachment placed on pins of the semiconductor chip package arranged to provide a short circuit across selected pins. Upon insertion into the receptor, the attachment is driven away from the semiconductor chip package, causing the short circuit to be broken. While this arrangement is an improvement and is useful for connectors for semiconductor chip packages such as DIPs, Dual Inline Package, the design requires that they be fairly large and clip to the semiconductor chip package which in the case of surface mount or other chips having pins on all four sides or numerous small pins, this can become unwieldy.

Other commonly assigned patents and copending applications include U.S. Pat. No. 4,971,568 entitled "Electrical Connector With Attachment For Automatically Shorting Select Conductors Upon Disconnection of Connector" by David V. Cronin issued Nov. 20, 1990, U.S. Pat. No. 5,163,850 entitled Electrostatic Discharge Protection Devices For Semiconductor Chip Packages" by David V. Cronin issued Nov. 17, 1992, U.S. Pat. No. 5,164,880 entitled "Electrostatic Discharge Protection Device for a Printed Circuit Board" by David V. Cronin issued Nov. 17, 1992, and pending U.S. application Ser. No. 234,917 entitled "Electrostatic Discharge Protection Device" by David V. Cronin filed Apr. 28, 1994.

In the case of surface mount microelectronic devices, or other SCPs which have large quantities of connector pins, additional problems arise in the difficulty of manufacturing the prior art electrostatic discharge protection devices and a loss of rigidity of the electrostatic discharge protection devices over a long span. With respect to the latter, if the electrostatic discharge protection device has only two points of contact for a row of connecting arms, one on each end, a long span causes the middle of the row to lag the outer parts of the row when pulling away due to flex in the structure over the long span.

Accordingly, it is an object of this invention to provide electrostatic discharge protection devices which operate to automatically open a short between selected conductors upon connection with a mating receptacle or are adapted to manually open the short circuit if a user desires the electrostatic discharge protection device to provide additional protection, such as electrical shielding while in place.

It is another object of this invention to provide electrostatic discharge protection devices for use with SCPs having numerous small pin conductors without sacrificing rigidity along the length of the structure.

It is still another object of the invention to provide an electrostatic discharge protection device which is easier and, therefore, less costly to manufacture.

These and other objects of the invention will be obvious and will appear hereinafter.

SUMMARY OF THE INVENTION

The aforementioned and other objects are achieved by the invention which provides, in one aspect, an electrostatic discharge protection device. The electrostatic discharge protection device is useful with semiconductor chip packages having a plurality of connector pins on which the electrostatic discharge protection device operates to automatically short the connector pins together while the SCP is disconnected from a host receptor.

An electrostatic discharge protection device for use with a semiconductor chip package of a type having a top surface and an opposite bottom surface and a plurality of lateral surfaces integral with said top and bottom surfaces where two or more of said lateral surfaces have extending therefrom a plurality of connector pins disposed in a spaced apart relationship with respect to each other. The electrostatic discharge protection device having a base section, grounding means extending from the base section and actuation means for moving the ground means between operative and inoperative positions.

The base section is generally planar and is usually equivalent in size to either the top or bottom surface of the semiconductor chip package. The base section is secured to said semiconductor chip package by using adhesive, clips or other methods well known in the art.

The grounding means comprises a series of grounding arms which are movable between operative and inoperative positions. When in the operative position, the grounding arms are connected across the connector pins to form a shunt between the selected connector pins.

Once electrostatic discharge protection is no longer needed or upon attachment to a mating receptacle, depending upon the embodiment, the electrostatic discharge protection device is displaced to the inoperative position. In the inoperative position, the grounding arms are disconnected from the connector pins thereby removing the shunt and allowing electrical isolation between the plurality of selected connector pins.

Movement of the grounding means between the operative and the inoperative positions is accomplished by the actuation means. The actuation means extends parallel to said two or more lateral surfaces of the semiconductor chip package and provides a gripping point, in the case of manual operation, or an extension below the semiconductor chip package in the case of automatic operation. In either case, the actuation means directly or indirectly causes movement between the operative and the inoperative positions.

The manually operated embodiments of the invention further include a safety feature to avoid placing a circuit board with an electrostatic discharge protection device in the operative position within a final enclosure, such as one having a cover. In that instance, said actuation means is fabricated to have a height sufficient to require movement of grounding means into the inoperative position in order to close the cover over the circuit board.

The invention is also useful for its shielding properties. When in an operative position, and less so in the inoperative position, electrical shielding of the SCP and the circuit board generally is provided by the electrostatic discharge protection device.

In further aspects the invention provides methods in accord with the apparatus described above, the aforementioned and other objects of the invention are evident in the drawings and in the description that follows.

BRIEF DESCRIPTION OF THE DRAWINGS

The foregoing and other objects of the invention the various features thereof as well as the invention itself may be more fully understood from the following description when read together with the accompanying drawings in which.

DESCRIPTION OF THE PREFERRED EMBODIMENT

Figure 1:
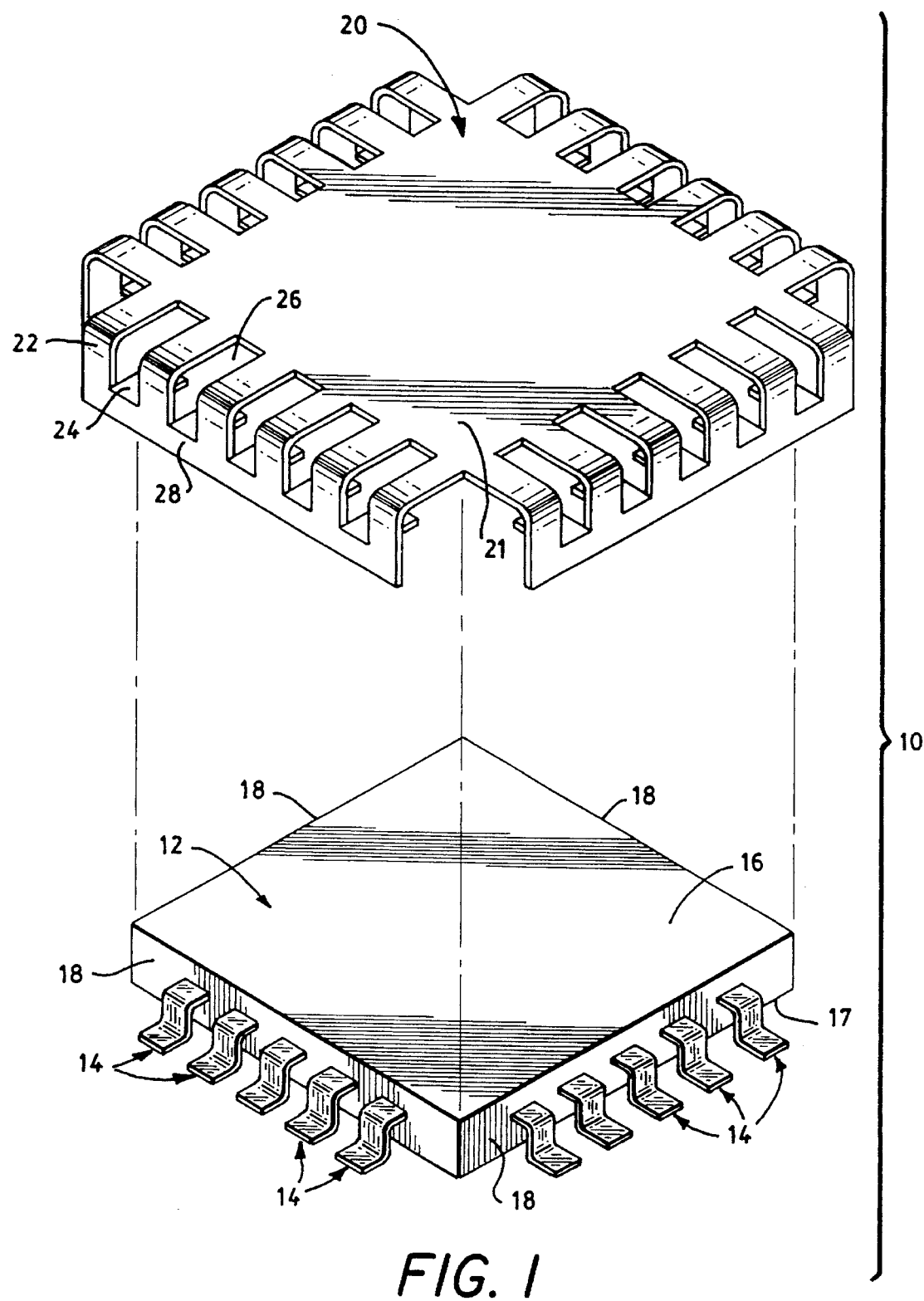
FIG. 1 shows an exploded perspective view of an electrostatic discharge protection device of this invention disposed above an SCP.
Figure 2:
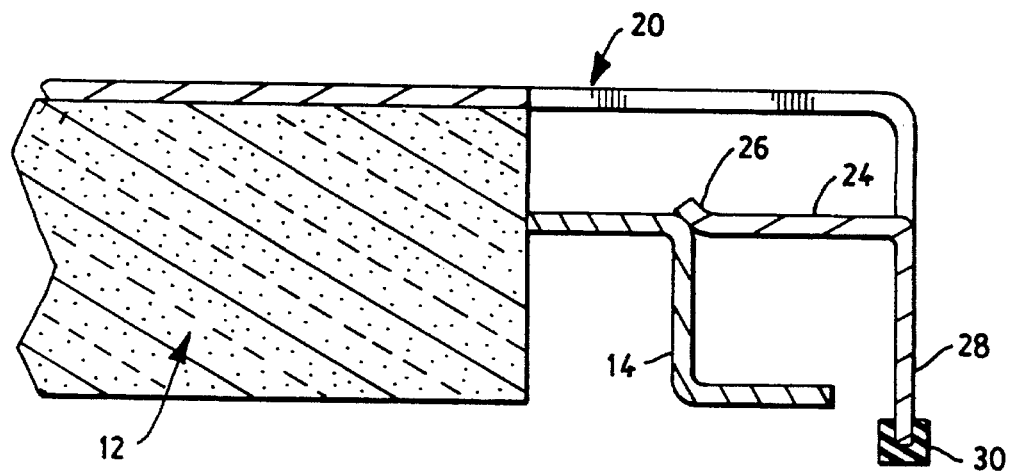
FIG. 2 shows a perspective view of the electrostatic discharge protection device shown in FIG. 1 mated to a top surface of the SCP shown in FIG. 1.
Figure 3:
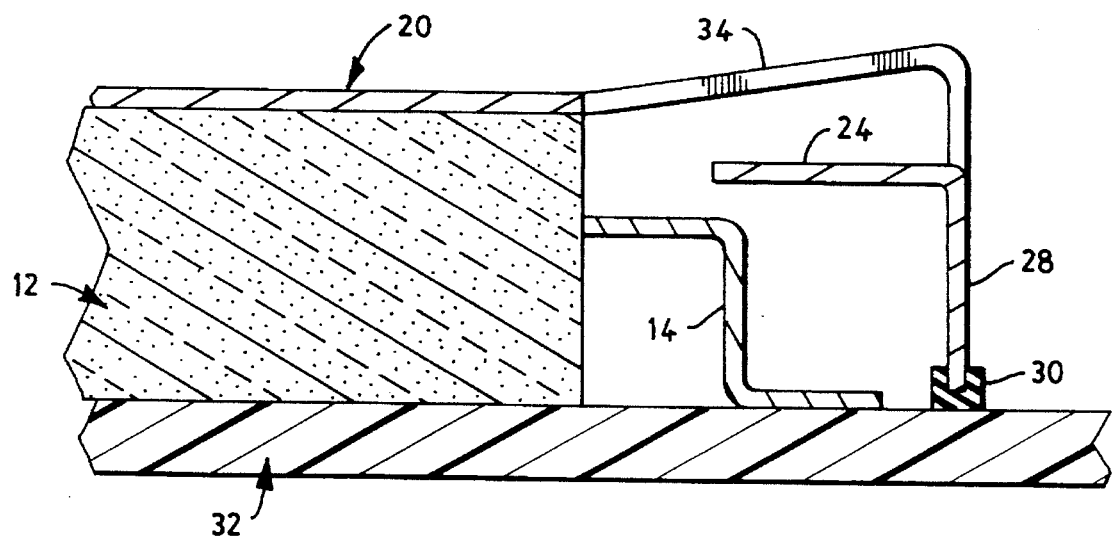
FIG. 3 is a perspective view of the electrostatic discharge protection device assembly as shown in FIG. 2 mated to a printed circuit board.

Referring now to FIGS. 1–3, there is shown generally at 10 a SCP-electrostatic discharge protection device combination comprising an electrostatic discharge protection device 20 of this invention, and a SCP 12. The SCP 12 generally described comprises a top surface 16, a bottom surface 17, and, between the top and bottom surfaces a plurality of lateral surfaces each marked 18. A plurality of connector pins 14 are disposed on each of the lateral surfaces 18 in a substantially parallel and spaced-apart relationship with respect to each other. Though the SCP pictured herein is a quad flat pack commonly used in surface mount technology, one skilled in the art will recognize that the invention may also be used with DIPs or other semiconductor chip packages.

The plurality of the connector pins 14 are adapted for physical and electrical connection to a connector, typically a printed circuit board having a substantially planar surface on one selected side thereof. The semiconductor chip package is inserted into receptacles in the printed circuit board or, in the case of surface mount, the chip package is placed in a printed position and secured to the surface of the printed circuit board.

In order to ensure that the connector pins 14 are shorted until they are secured on the printed circuit board, the electrostatic discharge protection device 20 of this embodiment comprises a base section 21 which is secured to the top surface 16 of the SCP. Extending from the base section on all four sides, or as many sides as the SCP has connector pins, is an integral grounding section with a plurality of shorting arms 24 extending therefrom. The shorting arms 24 are integral with the grounding section 22. In the preferred embodiment, the electrostatic discharge protection device is fabricated from a single sheet of beryllium copper from which the shorting arms are stamped out and pushed toward a center position such that a void 26 is created in the electrostatic discharge protection device where the shorting arm 24 used to be.

Other options for fabrication of electrostatic discharge protection devices are plastics which have been heavily doped with a conductive element, such as carbon, or have a conductive film deposition, or cladding.

An adhesive (not shown) disposed on the base section or clips disposed on the base section provide the electrostatic discharge protection device 20 with a secure attachment to the SCP 12.

The plurality of shorting arms 24 are yieldably biased by any means well known in the art such as built-in resilient spring bias. The resilient spring bias urges distal ends of the shorting arms 24 against the plurality of connector pins 14 thereby creating an electrical interconnection between the plurality of shorting arms 24 and the plurality of connector pins 14. Thus it is readily apparent from FIGS. 1–3 when not secured to the printed circuit board, the shorting arms 24 urge their respective distal end portions against and into electrical connection with the plurality of connector pins 14. In this manner the shorting of all or some of the plurality of connector pins 14 is accomplished so as to effectively protect the semiconductor chip package 12 from electrostatic discharge which could operate to damage the electrical circuitry within the SCP.

An extended portion 28 extends past and below the bottom surface of the SCP such that when the SCP is secured to the printed circuit board 32, the extended portion 28 hits the printed circuit board and is driven upward. The extended portion 28 then becomes even with the bottom portion of the semiconductor chip package. As the extended portion 28 is driven upward, the grounding section 22 forms a bend 34 near the base section 20. As the extended portion 28 is driven upward and the bend 34 is formed, the shorting arms 24 are drawn away from the connector pins 14 such that the physical and electrical connection between the shorting arms 24 and the connector pins 14 is disconnected.

The extended portion 28 runs substantially along the length of the SCP and provides rigidity along the length such that as the length increases there is minimal flex. Further, the extended portion 28 is coated with an insulator 30 along its entire length such that contact with the printed circuit board 32 does not create a short circuit across the printed circuit board 32.

Figure 4:
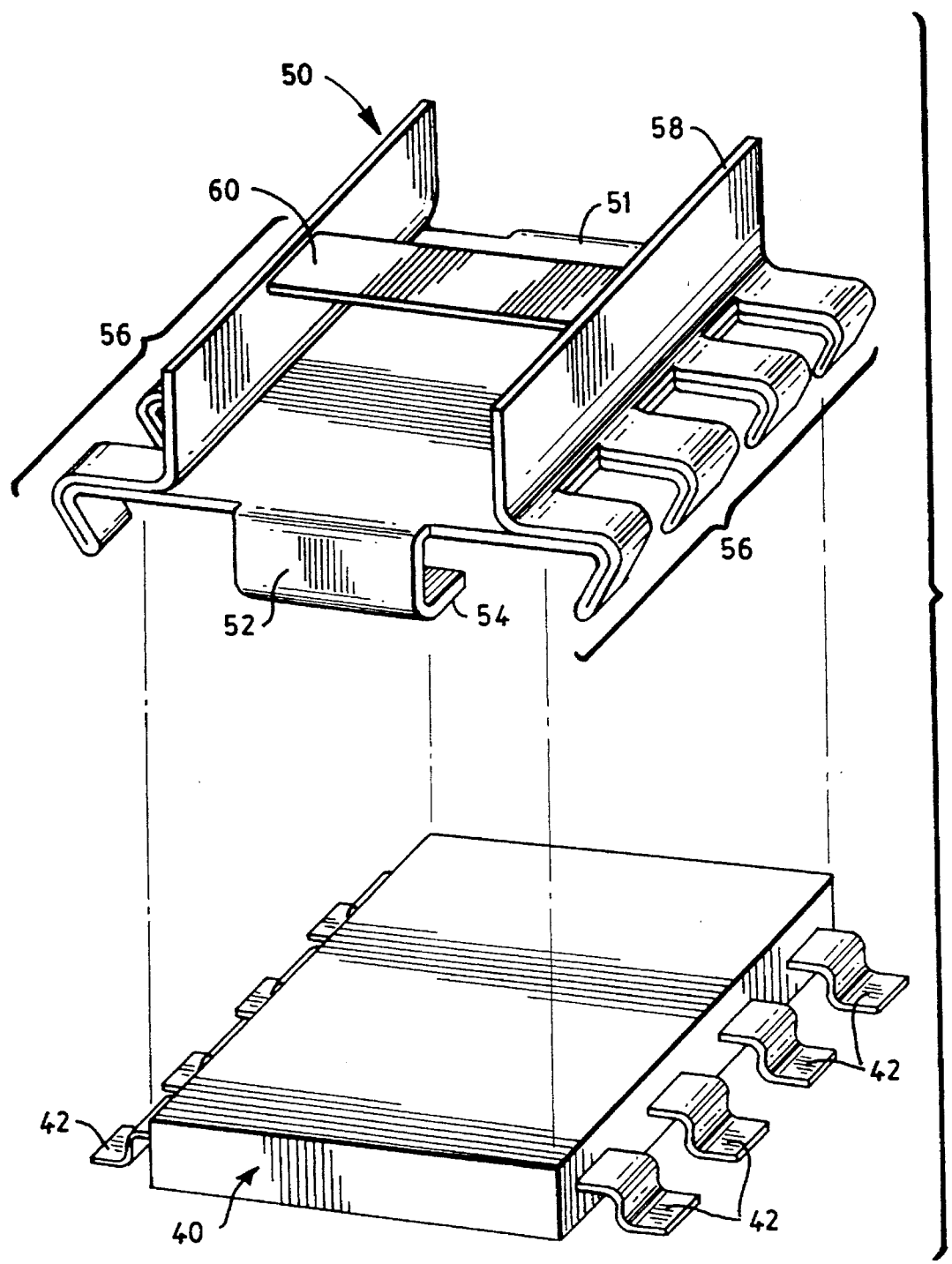
FIG. 4 is an exploded perspective view of an electrostatic discharge protection device of this invention disposed above an SCP.
Figure 5:
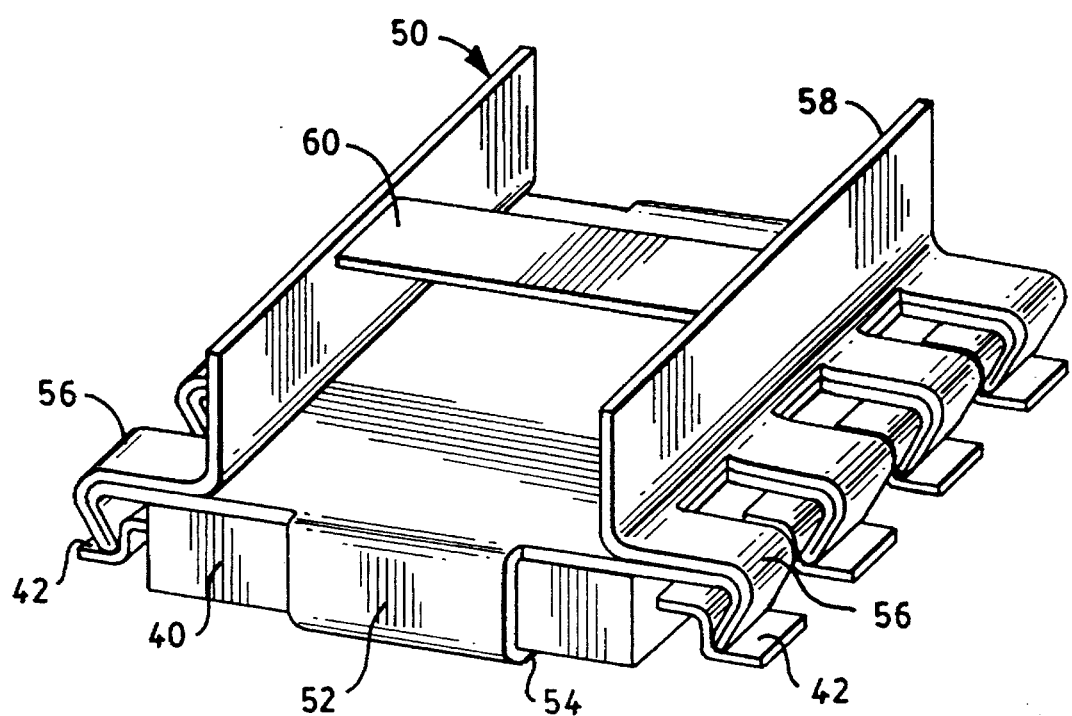
FIG. 5 is a perspective view of the electrostatic discharge protection device shown in FIG. 4 mated to a top surface of the SCP shown in FIG. 4.
Figure 6:
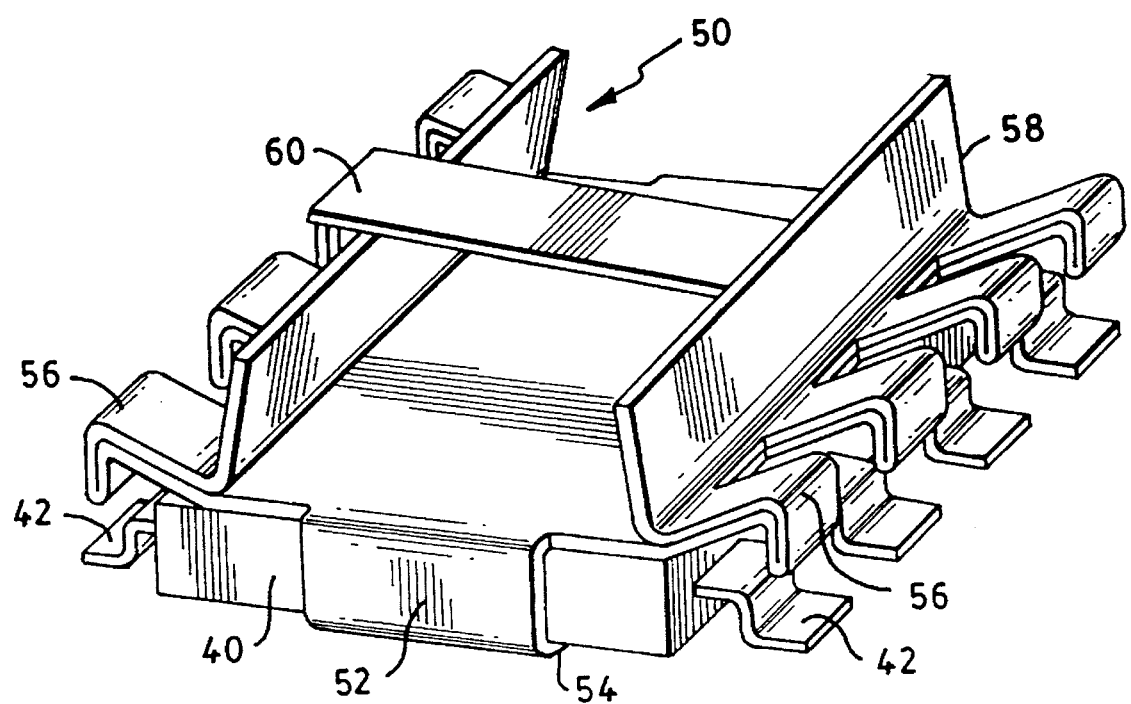
FIG. 6 is a perspective view of the electrostatic discharge protection device-SCP assembly shown in FIG. 5 mated to the SCP of FIG. 5 and shown in an inoperative position.

Referring now to FIGS. 4–6 where like numerals designate previously described embodiments, there is shown a second embodiment of the electrostatic discharge protection device 50 for a SCP 40. In contrast to the first embodiment of the electrostatic discharge protection device 20, this electrostatic discharge protection device 50 is manually operated to break electrical connections between shorting arms and between the electrostatic discharge protection device 50 and the SCP 40. Also, a SCP having only two rows of connection pins is shown to allow illustration of the clips for securing the electrostatic discharge protection device, as previously described. This unitary electrostatic discharge protection device 50 comprises a base section 51 secured to the top surface of the SCP 40 and a plurality of shorting arms 56 and gripping members 52. The plurality of shorting arms 56 extend outwardly from the base section 51 in spaced apart relationship with respect to each other and in spaced apart alignment with respect to the plurality of connector pins 42. Each of the plurality of shorting arms 56 have a first portion which is integral to the base section 51 and extend outwardly from the base section 51 in an integral connection to a respective one of the distal end portions.

In the preferred embodiment, the shorting arm that is actually connected to ground has a higher resistance than the other shorting arms. This is done so that electrostatic discharge, if present, drains slowly to ground, thus preventing high speed, harmful, induced internal transient currents. This is accomplished, in the preferred embodiment, by coating a contact surface of the ground shorting arm with a thin resistive coating, thus increasing electrical resistance.

Similarly, the gripping members 52 extend from integral connection to the base section 51 so as to provide the base section 51 with support and stability against lateral movement. Each of the gripping members 52 have a first portion extending vertically along the lateral edge of the SCP 40 and an integral second portion 54 which securely clasps the SCP 40 along the bottom surface of the SCP 40. Furthermore, an adhesive (not shown) disposed on the base section 51 can also be used to provide the electrostatic discharge protection device 50 with a further secure attachment to the SCP 40.

The gripping members 52, in addition to providing a point of manual contact by a user, have additional functions. First, the gripping members 52 provide longitudinal rigidity to reduce flex along the length of the structure. Second, circuit boards are often placed within small enclosures for final assembly. Since the electrostatic discharge protection device provides a short circuit, leaving it in place in the final assembly may lead to damage to the circuit board. Therefore, to avoid the scenario, the gripping members can be enlarged vertically in such a way that the circuit board cannot be placed within the small enclosure without placing the electrostatic discharge protection device in the inoperative position.

The shorting arms 56 are yieldably biased by means well known in the art such as built-in resilient spring bias so as to urge their respective surfaces against the plurality of connector pins 42 thereby creating an electrical interconnection between the plurality of shorting arms 56 and the plurality of connector pins 42. Thus, as readily apparent from FIGS. 4–6 when the plurality of connector pins 42 are not inserted onto a corresponding receptacle, the shorting arms urge their respective surfaces against and into respective electrical connection with the plurality of connector pins 42. In this manner, the shorting of all or some of the plurality of connector pins 42 is accomplished so as to effectively protect the SCP 40 from electrostatic discharge which could operate to damage the electrical circuitry within the SCP.

Unlike the first embodiment, the electrostatic discharge protection device illustrated in FIGS. 4–6 is manually operated in that upon attachment of the SCP 40 to a printed circuit board, the electrostatic discharge protection device 50 does not automatically withdraw the electrical shorting connection across the connector pins 42. In this way, electrostatic discharge protection can be provided while the printed circuit board is undergoing further assembly or packaging.

The electrostatic discharge protection device 50 is manually operated through the use of gripping members 58 extending from the base portion 51. In this embodiment the gripping members 58 are biased inward toward an axis of the electrostatic discharge protection device. The bias, in an operative position, is overcome by a bar 60, or other obstructive device, which bridges between the two gripping members 58 thus keeping the shorting arms 56 in contact with the connector pins 42.

When it is desired to remove the short across the connector pins 42 to place the electrostatic discharge protection device in an inoperative position, the bar 60 is popped out above the gripping members 58 such that one end of the bar 60 is no longer in physical contact with the gripping members 58. Thus, the inherent bias in the gripping members 58 causes the gripping members 58 to move inward at a pivot point directly below the gripping members forcing a withdrawal of the electrical connection between the shorting arms 56 and the connector pins 42.

Figure 7:
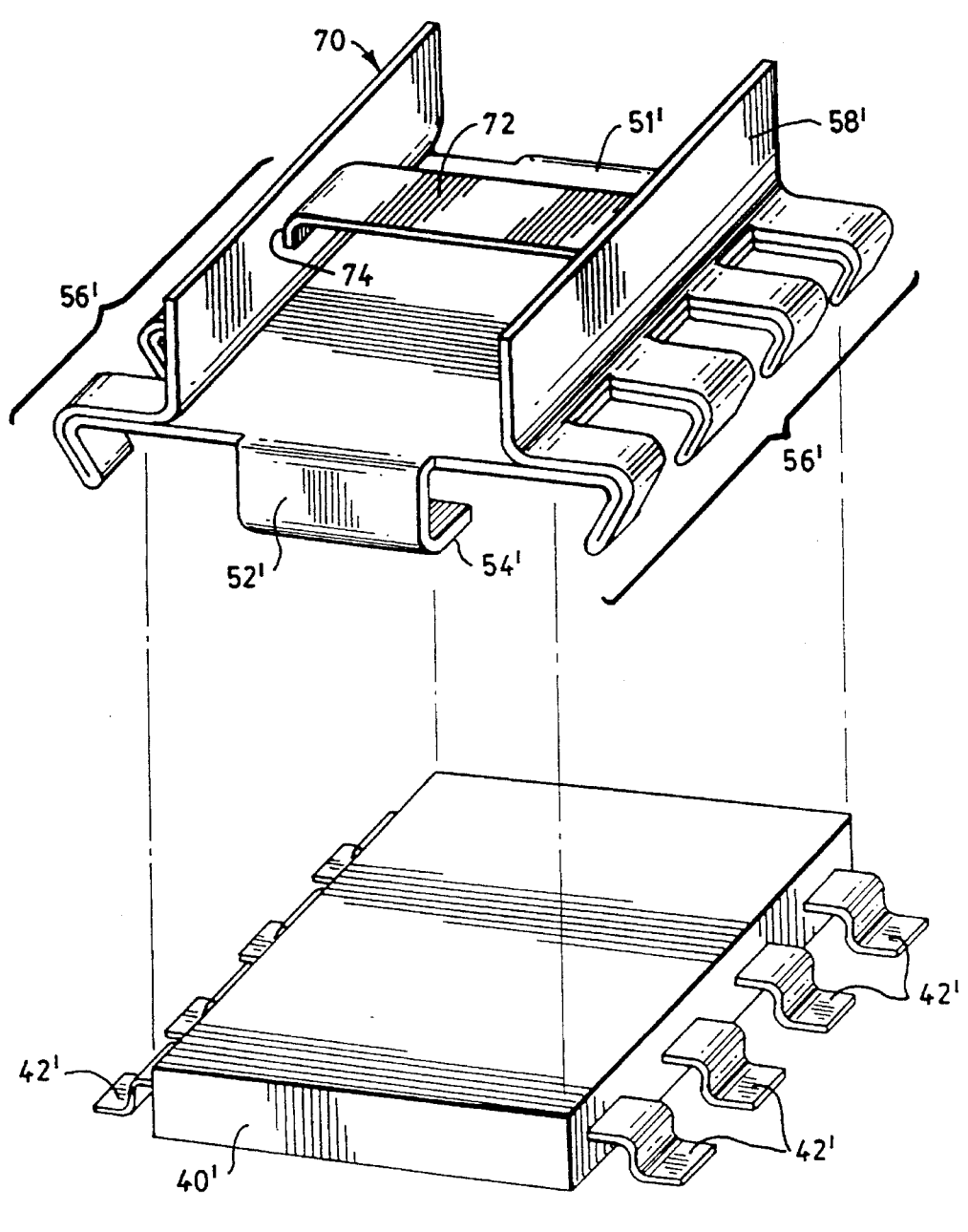
FIG. 7 is an exploded perspective view of an electrostatic discharge protection device of this invention disposed above an SCP.
Figure 8:
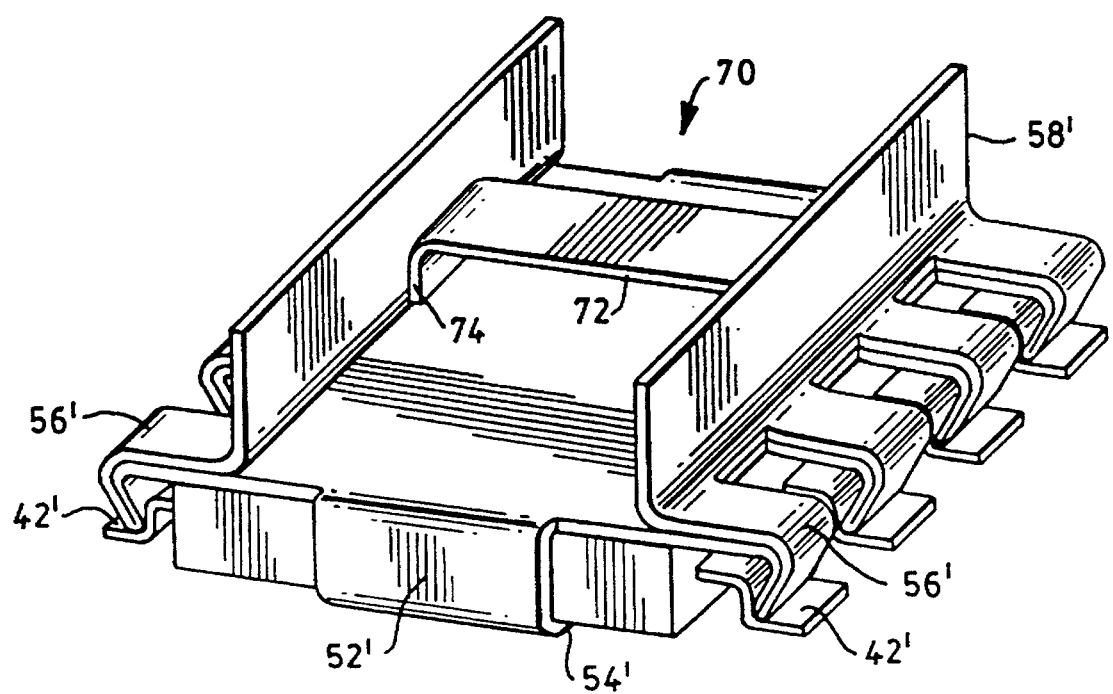
FIG. 8 is a perspective view of the electrostatic discharge protection device shown in FIG. 7 mated to the top surface of the SCP shown in FIG. 7.
Figure 9:
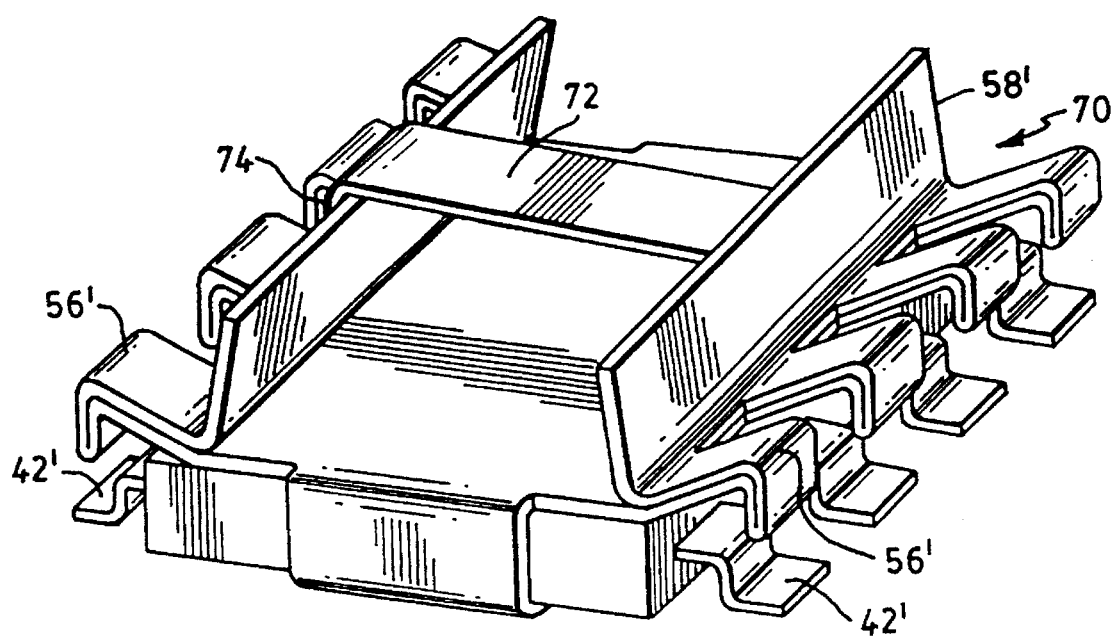
FIG. 9 is a perspective view of the electrostatic discharge protection device-SCP assembly shown in FIG. 8 mated to the top surface of the SCP shown in FIG. 8 and shown in an inoperative position.

Referring now to FIGS. 7–9 where like numerals designate previously described embodiments, there is shown a third embodiment of the electrostatic discharge protection device 70 for a SCP 40' providing an additional embodiment of a manually operated electrostatic discharge protection device. In contrast to the second embodiment of the electrostatic discharge protection device 50, this electrostatic discharge protection device 70 is outwardly biased as will be described hereinafter. This unitary electrostatic discharge protection device 70 comprises a base section 51' secured to the top surface of the SCP 40' and a plurality of shorting arms 56' and gripping members 52'. The plurality of shorting arms 56' extend outwardly from the base section 51' in spaced apart relationship with respect to each other and in spaced apart alignment with respect to the plurality of connector pins 42'. Each of the plurality of shorting arms 56' have a first portion which is integral to the base section 51' and extend outwardly from the base section 51' in an integral connection to a respective one of the distal end portions.

Similarly, the plurality of gripping members 52' extend from integral connection to the base section 51' and interdigitated spaced apart relationship with respect to the plurality of shorting arms 56' so as to provide the base section 51' with support and stability against lateral movement. Each of the gripping members 52' have a first portion extending vertically along the lateral edge of the SCP 40' and an integral second portion 54' which securely clasps the SCP 40' along the bottom surface of the SCP 40'. Furthermore, an adhesive (not shown) disposed on the base section 51' can also be used to provide the electrostatic discharge protection device 70 with a further secure attachment to the SCP 40'. The gripping members 58' provide the same functional requirements as described previously herein.

The shorting arms 56' are yieldably biased by means well known in the arts such as built-in resilient spring bias so as to urge their respective surfaces against the plurality of connector pins 42' thereby creating an electrical interconnection between the plurality of shorting arms 56' and the plurality of connector pins 42'. Thus, as readily apparent from FIGS. 7–9 when the plurality of connector pins 42' are not inserted onto a corresponding receptacle, the shorting arms urge their respective surfaces against and into respective electrical connection with the plurality of connector pins 42'. In this manner, the shorting of all or some of the plurality of connector pins 42' is accomplished so as to effectively protect the SCP 40' from electrostatic discharge which could operate to damage the electrical circuitry within the SCP.

The electrostatic discharge protection device 70 is manually operated through the use of gripping members 58' extending from the base portion 51'. In this embodiment the gripping members 58' are biased away from an axis of the electrostatic discharge protection device. In the operative position the bias urges the gripping members 58' open keeping the shorting arms 56' thus keeping the shorting arms 56' in contact with the connector pins 42'.

When it is desired to remove the short across the connector pins 42, the user pinches the gripping members 58' together to a point where a hook 72, or latch, engages to hold the gripping members in the inoperative position. Thus the inherent bias in the gripping members 58' is overcome to move the gripping members 58' at a bend point directly below the gripping members 58' forcing a withdrawal of the electrical connection between the shorting arms 56' and the connector pins 42'.

[The invention may be embodied in other specific forms without departing from the spirit or essential characteristics thereof. The present embodiments are, therefore, to be considered in all respects as illustrative and not restrictive, the scope of the invention being indicated by the appended claims rather than by the foregoing description and all changes which come within the meaning and range of equivalency of the claims are therefore intended to be embraced therein.]

Figure 10:
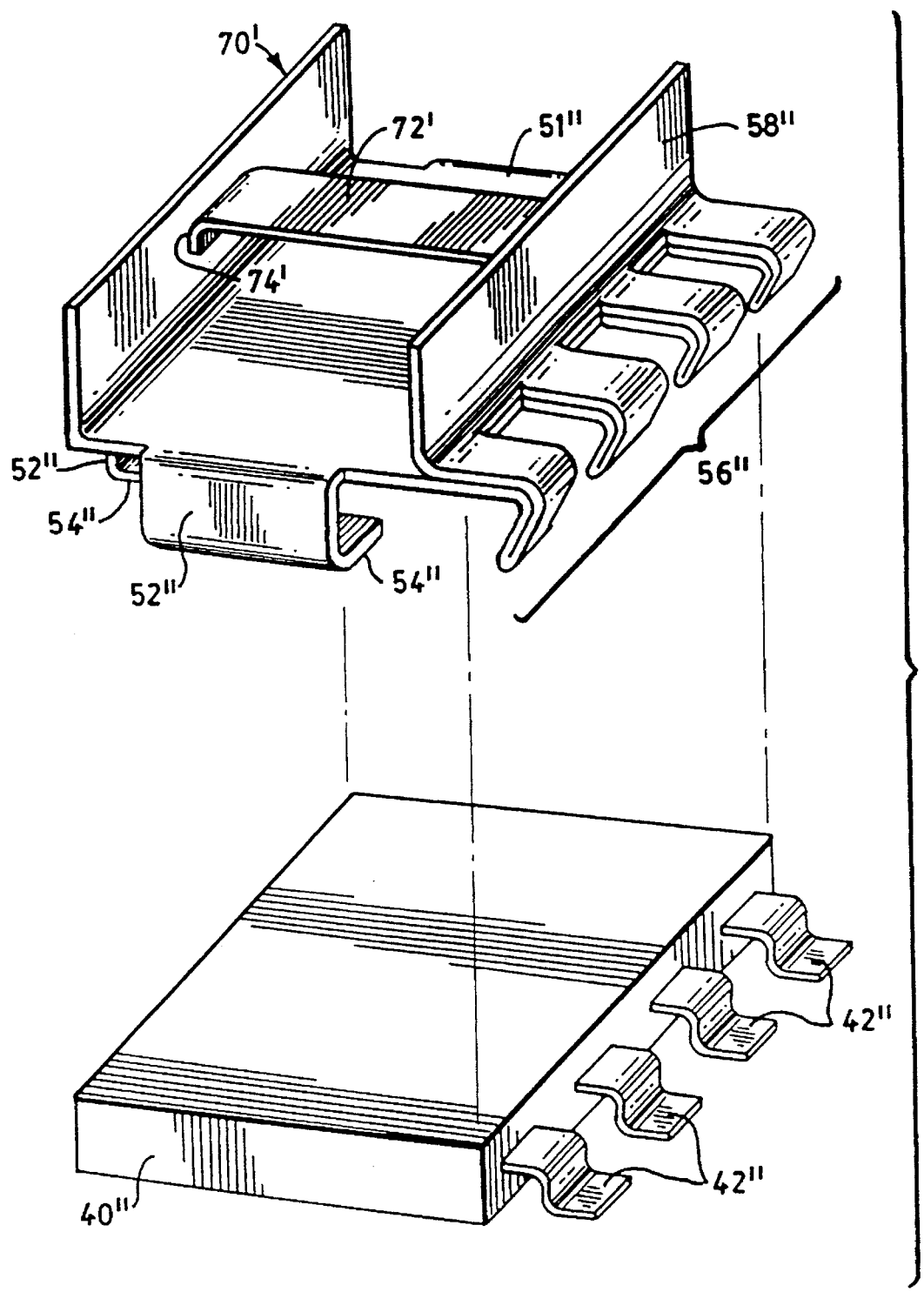
FIG. 10 is an exploded perspective view of an electrostatic discharge protection device of this invention disposed above an SCP.
Figure 11:
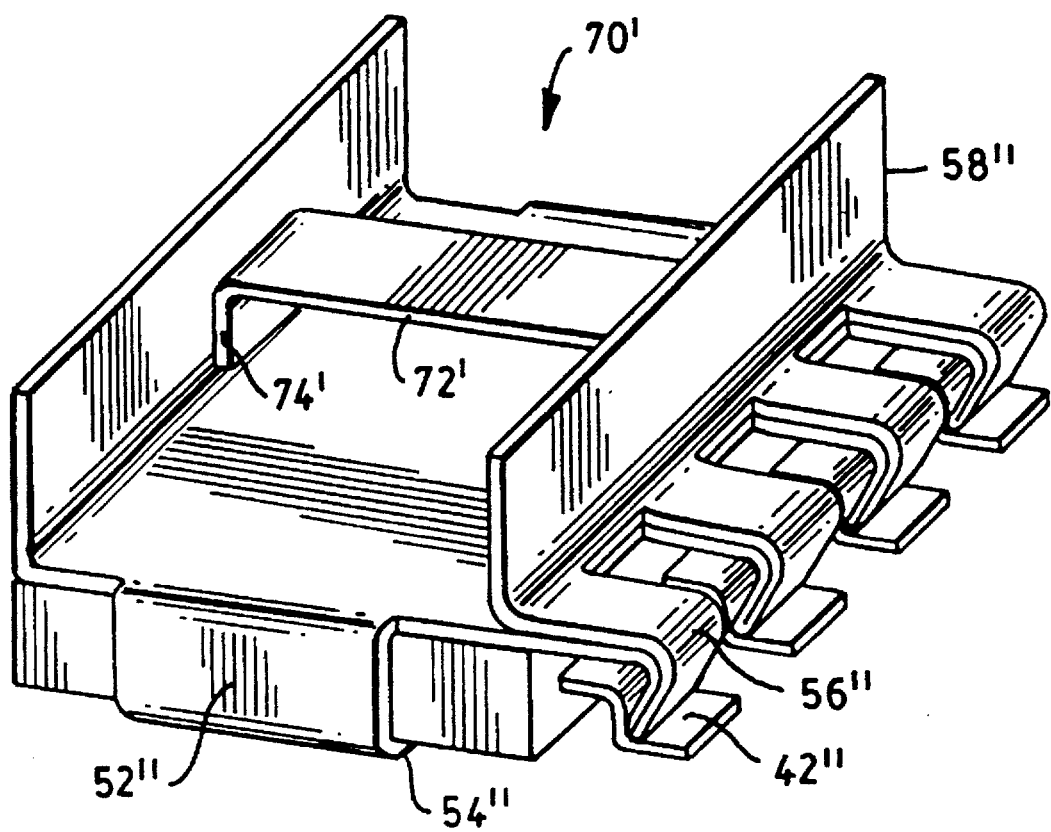
FIG. 11 is a perspective view of the electrostatic discharge protection device shown in FIG. 7 mated to the top surface of the SCP shown in FIG. 10.
Figure 12:
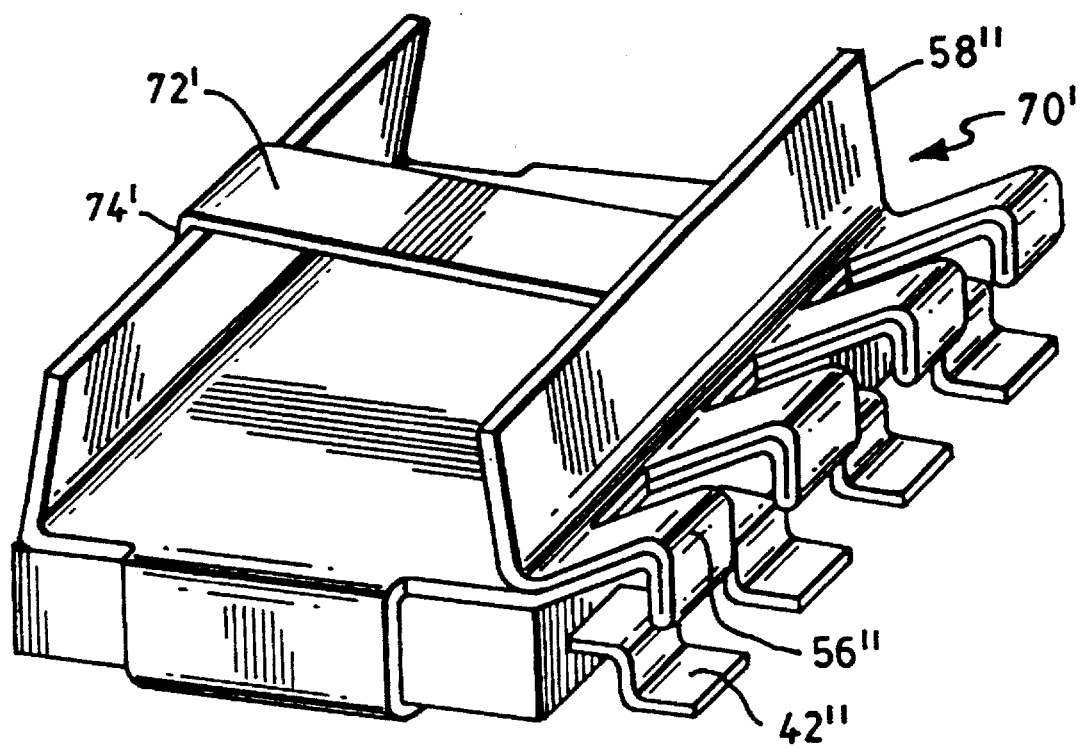
FIG. 12 is a perspective view of the electrostatic discharge protection device-SCP assembly shown in FIG. 8 mated to the top surface of the SCP shown in FIG. 11 and shown in an inoperative position.

Referring now to FIGS. 10–12 where like numerals designate previously described embodiments, there is shown a [third] fourth embodiment of the electrostatic discharge protection device [70] 70' for a SCP [40'] 40" providing an additional embodiment of a manually operated electrostatic discharge protection device. [In contrast to the second] As with the previous embodiment of the electrostatic discharge protection device [50'] 70, this electrostatic discharge protection device [70] 70' is outwardly biased [as will be described hereinafter].

This unitary electrostatic discharge protection device [70] 70' comprises a base section [51'] 51" secured to the top surface of the SCP [40'] 40" and a plurality of shorting arms [56'] 56" and gripping members [52'] 52". The plurality of shorting arms [56'] 56" extend outwardly from the base section [51'] 51" in spaced apart relationship with respect to each other and in spaced apart alignment with respect to the plurality of connector pins [42'] 42". Each of the plurality of shorting arms [56'] 56" have a first portion which is integral to the base section [51'] 51" and extend outwardly from the base section [51'] 51" in an integral connection to a respective one of the distal end portions.

Similarly, the plurality of gripping members [52'] 52" extend from integral connection to the base section [51'] 51" and interdigitated spaced apart relationship with respect to the plurality of shorting arms [56'] 56" so as to provide the base section [51'] 51" with support and stability against lateral movement. Each of the gripping members [52'] 52" have a first portion extending vertically along the lateral edge of the SCP [40'] 40 " and an integral second portion

[54'] 54" which securely clasps the SCP [40'] 40" along the bottom surface of the SCP [40'] 40". Furthermore, an adhesive (not shown) disposed on the base section [51'] 51" can also be used to provide the electrostatic discharge protection device [70] 70' with a further secure attachment to the SCP [40'] 40". The gripping members [58'] 58" provide the same functional requirements as described previously herein.

The shorting arms [56'] 56" are yieldably biased by means well known in the arts such as built-in resilient spring bias so as to urge their respective surfaces against the plurality of connector pins [42'] 42" thereby creating an electrical interconnection between the plurality of shorting arms [56'] 56" and the plurality of connector pins [42'] 42". Thus, as readily apparent from FIGS. [7–9] 10–12 when the plurality of connector pins [42'] 42" are not inserted onto a corresponding receptacle, the shorting anus urge their respective surfaces against and into respective electrical connection with the plurality of connector pins [42'] 42". In this manner, the shorting of all or some of the plurality of connector pins [42'] 42" is accomplished so as to effectively protect the SCP [40'] 40" from electrostatic discharge which could operate to damage the electrical circuitry within the SCP.

The electrostatic discharge protection device [70] 70' is manually operated through the use of gripping members [58'] 58" extending from the base portion [51'] 51". In this embodiment the gripping members [58'] 58" are biased away from an axis of the electrostatic discharge protection device. In the operative position the bias urges the gripping members [58'] 58" open, thus keeping the shorting arms [56'] 56" in contact with the connector pins [42'] 42".

When it is desired to remove the short across the connector pins [42'] 42", the user pinches the gripping members [58'] 58" together to a point where a hook [72] 72', or latch, engages to hold the gripping members in the inoperative position. Thus the inherent bias in the gripping members [58'] 58" is overcome to move the gripping members [58'] 58" at a bend point directly below the gripping members [58'] 58" forcing a withdrawal of the electrical connection between the shorting arms [56'] 56" and the connector pins [42']

[The invention may be embodied in other specific forms without departing from the spirit or essential characteristics thereof. The present embodiments are, therefore, to be considered in all respects as illustrative and not restrictive, the scope of the invention being indicated by the appended claims rather than by the foregoing description and all changes which come within the meaning and range of equivalency of the claims are therefore intended to be embraced therein]

Figure 13:
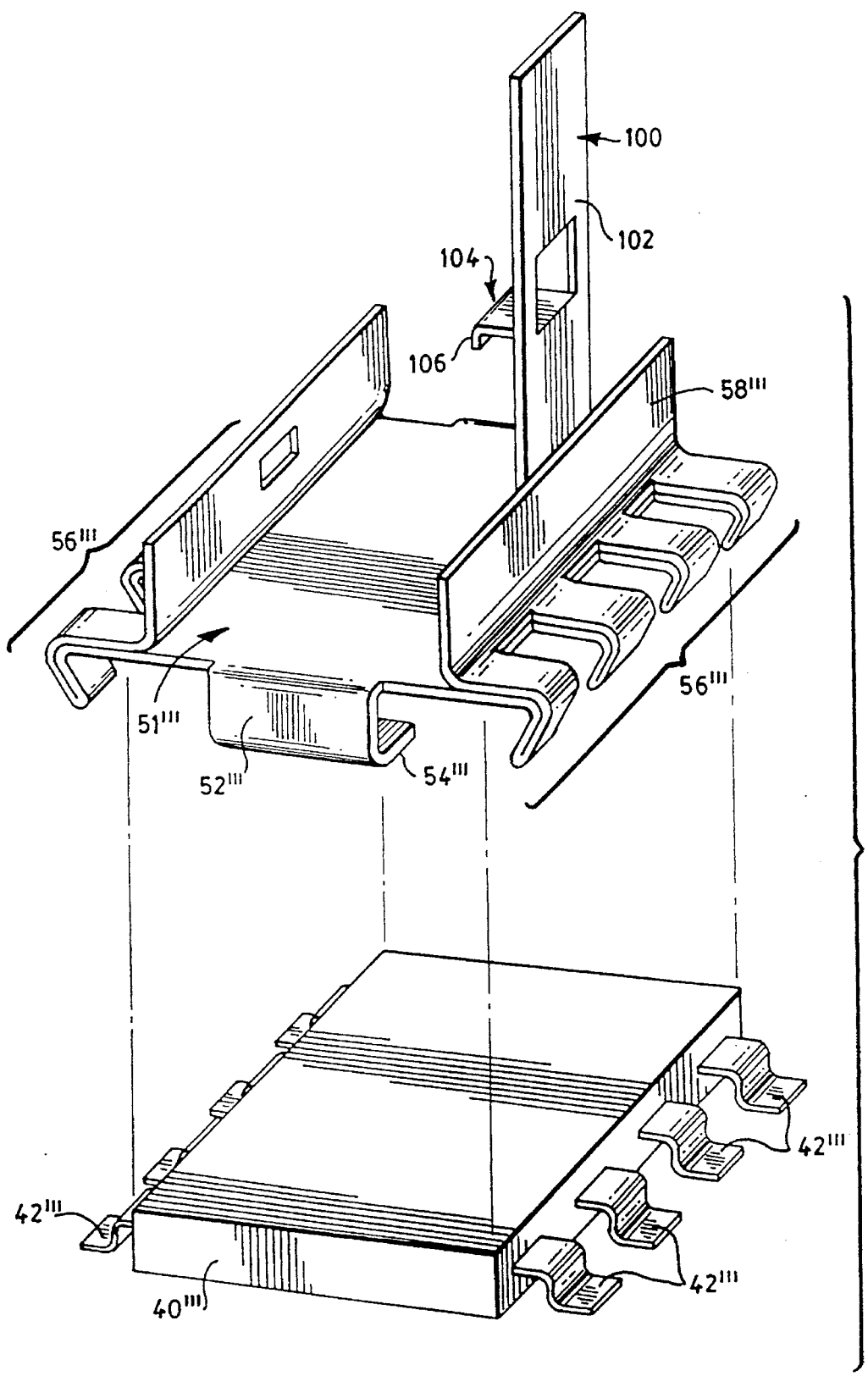
FIG. 13 is an exploded perspective view of an electrostatic discharge protection device of this invention disposed above an SCP.
Figure 14:
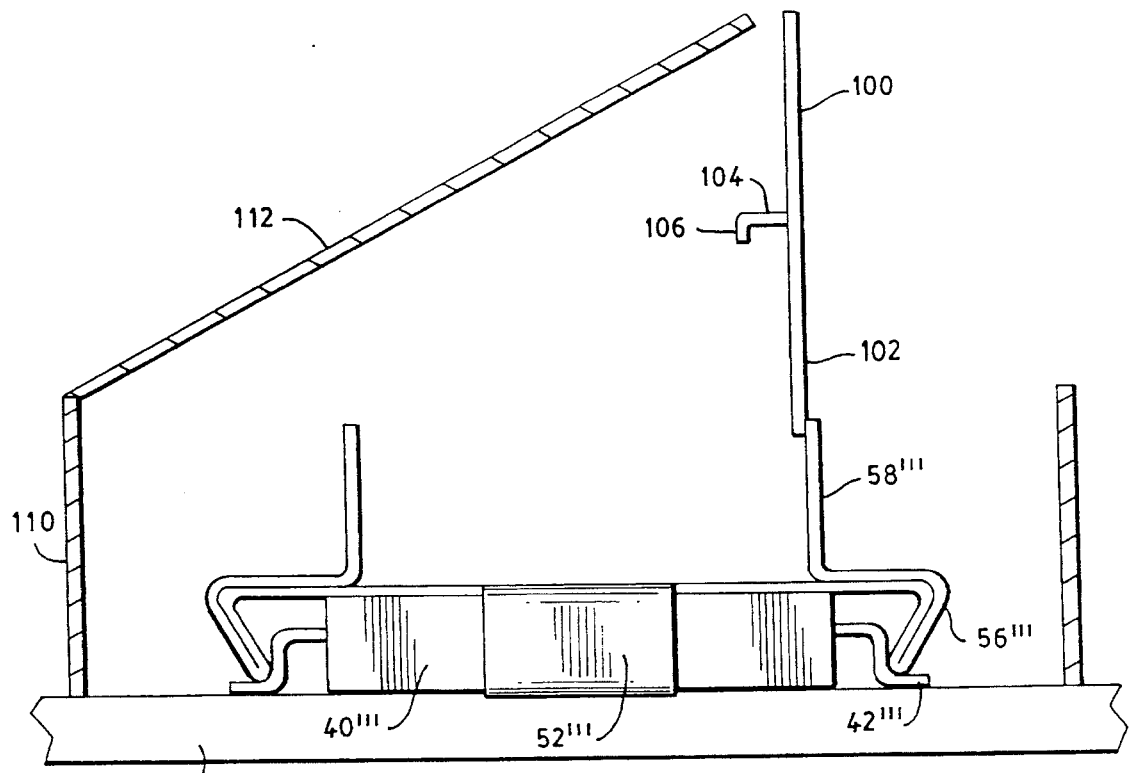
FIG. 14 is a perspective view of the electrostatic discharge protection device shown in FIG. 13 mated to the top surface of the SCP shown in FIG. 10.
Figure 15:
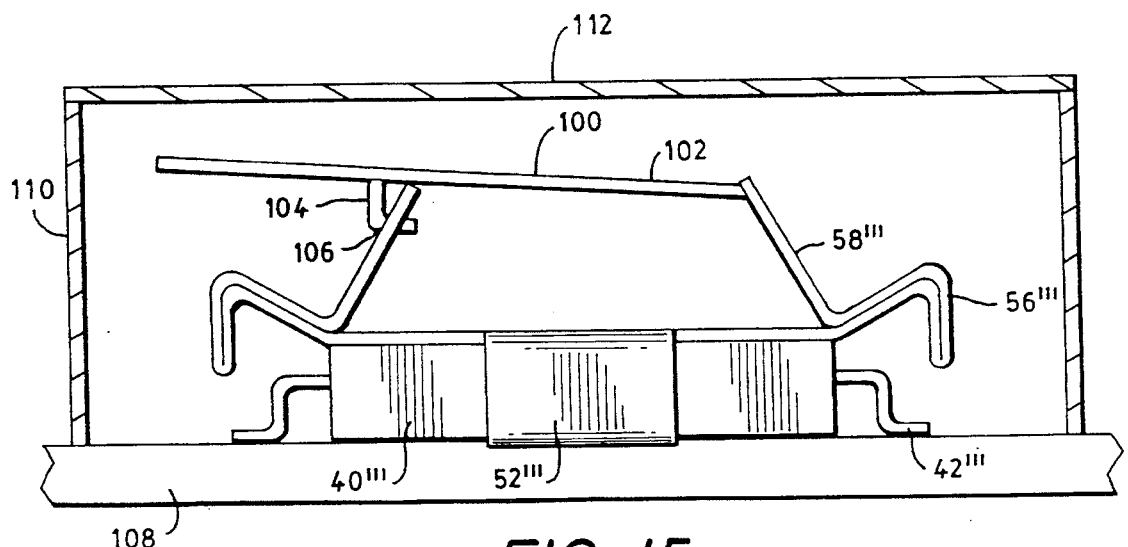
FIG. 15 is a perspective view of the electrostatic discharge protection device-SCP assembly shown in FIG. 14 mated to the top surface of the SCP shown in FIG. 11 and shown in an inoperative position.

Referring now to FIGS. 13–15 where like numerals designate previously described embodiments, there is shown a third embodiment of the electrostatic discharge protection device [70] 100 for a SCP [40] 40''' providing an additional embodiment of a manually operated electrostatic discharge protection device. [In contrast to the second] As with the previous embodiment of the electrostatic discharge protection device [50] 70', this electrostatic discharge protection device [70] 70" is outwardly biased [as will be described hereinafter]. This [unitary] electrostatic discharge protection device [70] 100 comprises a base section [51] 51''' secured to the top surface of the SCP [40] 40''' and a plurality of shorting arms [56] 56''' and gripping members [52] 52'''. The plurality of shorting arms [56] 56''' extend outwardly from the base section [51] 51''' in spaced apart relationship with respect to each other and in spaced apart alignment with respect to the plurality of connector pins [42] 42'''. Each of the plurality of shorting arms [56] 56''' have a first portion which is integral to the base section [51] 51''' and extend outwardly from the base section [51] 51''' in an integral connection to a respective one of the distal end portions.

Similarly, the plurality of gripping members [52] 52''' extend from integral connection to the base section [51] 51''' and interdigitated spaced apart relationship with respect to the plurality of shorting arms [56] 56''' so as to provide the base section [51] 51''' with support and stability against lateral movement. Each of the gripping members [52] 52''' have a first portion extending vertically along the lateral edge of the SCP [40] 40''' and an integral second portion [54] 54''' which securely clasps the SCP [40] 40''' along the bottom surface of the SCP [40] 40'''. Furthermore, an adhesive (not shown) disposed on the base section [51] 51''' can also be used to provide the electrostatic discharge protection device [70] 100 with a further secure attachment to the SCP [40] 40". The gripping members [58] 58∝1' provide the same functional requirements as described previously herein.

The shorting arms [56] 56''' are yieldably biased by means well known in the arts such as built-in resilient spring bias so as to urge their respective surfaces against the plurality of connector pins [42] 42''' thereby creating an electrical interconnection between the plurality of shorting arms [56] 56''' and the plurality of connector pins [42] 42'''. Thus, as readily apparent from FIGS. [7–9] 13–15 when the plurality of connector pins [42] 42∝1' are not inserted onto a corresponding receptacle, the shorting arms urge their respective surfaces against and into respective electrical connection with the plurality of connector pins [42] 42'''. In this manner, the shorting of all or some of the plurality of connector pins [42] 42''' is accomplished so as to effectively protect the SCP [40] 40''' from electrostatic discharge which could operate to damage the electrical circuitry within the SCP 40'''.

This embodiment is particularly useful for an SCP 40''' which is used in an enclosure 110 having a cover 112. A vertical extension 102 in the electrostatic discharge protection device 100 is fabricated to have a height sufficient to interfere with the cover when the electrostatic discharge protection device 100 is in the operative position. When the electrostatic discharge protection device 100 is placed in the inoperative position as later herein described, the vertical extension 102 folds below the cover thus allowing the cover to dose.

The electrostatic discharge protection device [70] 100 is manually operated through the use of gripping members [58] 58''' extending from the base portion [51 ] 51'''. In this embodiment the gripping members [58] 58''' are biased away from an axis of the electrostatic discharge protection device. In the operative position the bias urges the gripping members [58] 58''' open keeping the shorting arms [56] 56''' thus keeping the shorting arms [56] 56''' in contact with the connector pins [42] 42'''. When it is desired to remove the short across the connector pins [42] 42''', the user pinches the gripping members [58] 58''' together to a point where a hook [72] 106, or latch, on a horizontal extension 104 engages to hold the gripping members in the inoperative position. The hook interconnects with an aperture in one of the gripping members 58''' to securely hold the gripping members 58'''. Thus the inherent bias in the gripping members [58] 58''' is overcome to move the gripping members [58] 58''' at a bend point directly below the gripping members [58] 58''' forcing a withdrawal of the electrical connection between the shorting arms [56] 56''' and the connector pins [42] 42'''.

The invention may be embodied in other specific forms without departing from the spirit or essential characteristics thereof. The present embodiments are, therefore, to be considered in all respects as illustrative and not restrictive, the scope of the invention being indicated by the appended claims rather than by the foregoing description and all changes which come within the meaning and range of equivalency of the claims are therefore intended to be embraced therein.

I claim:

1. An electrostatic discharge protection device for use with a semiconductor chip package of a type having a top surface and an opposite bottom surface and a plurality of lateral surfaces integral with said top and bottom surfaces where one or more of said lateral surfaces have extending therefrom a plurality of connector pins disposed in a spaced apart relationship with respect to each other, said electrostatic discharge protection device comprising:

a base section to said semiconductor chip package;
grounding means extending from said base section having an operative position for connecting a shunt across the plurality of connector pins, and having an inoperative position for disconnecting said shunt providing electrical isolation between the plurality of connector pins while the base section remains secured to said semiconductor chip package, and actuation means extending from said base portion and integral with said grounding means for manually moving said grounding means between said operative and inoperative positions without cooperation from a mating receptacle.

2. The electrostatic discharge protection device according to claim 1 wherein said actuation means extends substantially vertically relative to said base section in a direction away from the semiconductor chip package (SCP) and substantially parallel to the shunt across the plurality of connector pins to provide a point of user contact.

3. The electrostatic discharge protection device according to claim 2 wherein the semiconductor chip package is attached to a circuit board and the circuit board is encased by a cover, said actuation means having a height sufficient to require movement of the grounding means into the inoperative position in order to close said cover over the circuit board.

4. The electrostatic discharge protection device according to claim 2 wherein said actuation means further comprises an obstructive device extending from said actuation means to inhibit movement of said actuation means from said operative position, said obstructive device being displaceable to allow movement of the actuation means into the inoperative position.

5. The electrostatic discharge protection device according to claim 4 wherein said actuation means comprises a first and second vertical structure and said obstructive device is a bar extending from the first vertical structure to the second vertical structure.

6. The electrostatic discharge protection device according to claim 2 wherein said actuation means further comprises a latching device extending from said actuation means to hold said actuation means such that the grounding means is retained in the inoperative position.

7. The electrostatic discharge protection device according to claim 6 wherein said actuation means comprises a first and second vertical structure and said latching device is a hook extending from the first vertical structure to the second vertical structure.

8. An electronic discharge protection device for use with a semiconductor chip package of a type having a top surface and an opposite bottom surface and a plurality of lateral surfaces integral with said top and bottom surfaces where one or more of said lateral surfaces have extending therefrom a plurality of where one or more of said lateral surfaces have extending therefrom a plurality of connector pins disposed in a spaced apart relationship with respect to each other, said electrostatic discharge protection device comprising a base section secured to said semiconductor chip package;

grounding means extending from said base section having an operative position for connecting a shunt across the plurality of connector pins, and having an inoperative position for disconnecting said shunt providing electrical isolation between the plurality of connector pins; and actuation means extending from said base portion substantially vertically relative to said base seal on and integrally from said grounding means in a direction away from the SCP for manually moving said grounding means between said operative and inoperative positions, the actuation means having at least two opposed vertical portions where movement of the at least two opposed vertical portion relative to the other effects a corresponding movement of the grounding means.

9. The electrostatic discharge protection device according to claim 8 wherein the semiconductor chip package is attached to a circuit board and the circuit board is encased by a cover, said actuation means has a height sufficient to require movement of grounding means into the inoperative position in order to close said cover over the circuit board.

10. The electrostatic discharge protection device according to claim 8 wherein said actuation means further includes an obstructive device extending from said actuation means to inhibit movement of said actuation means from said operative position, said obstructive device being displaceable to allow movement of the actuation means into the inoperative position.

11. The electrostatic discharge protection device according to claim 10 wherein said actuation means comprises a first and second vertical structure and said obstructive device is a bar extending from the first vertical structure to the second vertical structure.

12. The electrostatic discharge protection device according to claim 8 wherein said actuation means further includes a latching device extending from said actuation means to hold said actuation means such that the grounding means is retained in the inoperative position.

13. The electrostatic discharge protection device according to claim 12 wherein said actuation means comprises a first and second vertical structure and said latching device is a hook extending from the first vertical structure to the second vertical structure.

14. An electrostatic discharge protection device for use with a semiconductor chip package attached to a circuit board having a cover, the semiconductor chip package being of type having a top surface and an opposite bottom surface and a plurality of lateral surfaces integral with said top and bottom surfaces where one or more of said lateral surfaces have extending therefrom a plurality of connector pins disposed in a spaced apart relationship with respect to each other, said electrostatic discharge protection device comprising a base section secured to said semiconductor chip package;

grounding means extending from said base section having an operative position for connecting a shunt across the plurality of connector pins, and having an inoperative position for disconnecting said shunt providing electrical isolation between the plurality of connector pins while the base section remains secured to said semiconductor chip package; and actuation means extending from said base portion substantially vertically and having a height sufficient to require movement of grounding means into the inoperative position in order to close said cover over the circuit board, the actuation means for manually moving said grounding means between said operative and inoperative positions.

\* \* \* \* \*